United States Patent
Tamura

(10) Patent No.: US 10,770,373 B2
(45) Date of Patent: Sep. 8, 2020

(54) RADIATOR FOR LIQUID COOLING TYPE COOLING DEVICE AND METHOD OF PRODUCING THE SAME

(71) Applicant: SHOWA DENKO K.K., Tokyo (JP)

(72) Inventor: Shinobu Tamura, Oyama (JP)

(73) Assignee: SHOWA DENKO K.K., Tokyo (JP)

(*) Notice: Subject to any disclaimer, the term of this patent is extended or adjusted under 35 U.S.C. 154(b) by 0 days.

(21) Appl. No.: 16/471,566

(22) PCT Filed: Nov. 27, 2017

(86) PCT No.: PCT/JP2017/042423
§ 371 (c)(1),
(2) Date: Jun. 20, 2019

(87) PCT Pub. No.: WO2018/123387
PCT Pub. Date: Jul. 5, 2018

(65) Prior Publication Data
US 2019/0393132 A1 Dec. 26, 2019

(30) Foreign Application Priority Data
Dec. 28, 2016 (JP) .................................. 2016-254684

(51) Int. Cl.
*H05K 7/20* (2006.01)
*H01L 23/473* (2006.01)
(Continued)

(52) U.S. Cl.
CPC ............ *H01L 23/473* (2013.01); *B23P 15/26* (2013.01); *F28F 3/025* (2013.01); *F28F 3/06* (2013.01);
(Continued)

(58) Field of Classification Search
None
See application file for complete search history.

(56) References Cited

U.S. PATENT DOCUMENTS

| 4,765,397 | A | * | 8/1988 | Chrysler | ................ | H01L 23/473 |
| | | | | | | 165/104.33 |
| 5,957,194 | A | * | 9/1999 | Azar | ....................... | F28F 13/06 |
| | | | | | | 165/80.3 |

(Continued)

FOREIGN PATENT DOCUMENTS

JP  08-172150  7/1996
JP  2002-184922  6/2002
(Continued)

OTHER PUBLICATIONS

International Search Report for corresponding International Application No. PCT/JP2017/042423, dated Jan. 30, 2018.
(Continued)

*Primary Examiner* — Courtney L Smith
(74) *Attorney, Agent, or Firm* — Mori & Ward, LLP

(57) ABSTRACT

A radiator for a liquid cooling type cooling device includes a plurality of fin plates and connecting members integrally connecting all the fin plates. The fin plate includes a vertically elongated rectangular flat plate body and narrow portions integrated with both end portions of the plate body. All the fin plates are arranged at intervals in the thickness direction of the plate body. The connecting member is formed into a corrugated shape and includes flat plate portions each integrated with the narrow portion of the plate body and arcuate portions and each connecting the adjacent flat plate portions. The plate body, the narrow portion, and the flat plate portion are equal in thickness. Both side surfaces of the plate body, both side surfaces of the narrow portion, and both side surfaces of the flat plate portion are positioned on the same plane.

11 Claims, 9 Drawing Sheets

(51) Int. Cl.
   *B23P 15/26* (2006.01)
   *F28F 3/02* (2006.01)
   *F28F 3/06* (2006.01)
   *H01L 23/367* (2006.01)

(52) U.S. Cl.
   CPC ..... *H01L 23/3672* (2013.01); *H05K 7/20218* (2013.01); *H05K 7/20927* (2013.01)

(56) References Cited

U.S. PATENT DOCUMENTS

| | | | |
|---|---|---|---|
| 6,401,810 B1* | 6/2002 | Kuo | F28F 3/02 165/185 |
| 6,651,733 B1* | 11/2003 | Horng | F28D 15/02 165/104.33 |
| 9,134,077 B2* | 9/2015 | Tang | F28F 3/06 |
| 9,184,108 B2* | 11/2015 | Ankireddi | H01L 23/3672 |
| 10,127,949 B2* | 11/2018 | Mayhall | G11B 25/043 |
| 10,302,372 B2* | 5/2019 | Minami | B23K 1/0012 |
| 10,563,926 B2* | 2/2020 | Wang | H01L 23/427 |
| 2009/0114372 A1* | 5/2009 | Ippoushi | F28F 13/12 165/104.14 |
| 2015/0189791 A1* | 7/2015 | Tamura | F28D 1/04 165/148 |
| 2016/0343640 A1* | 11/2016 | Gohara | H05K 7/20927 |
| 2019/0088844 A1* | 3/2019 | Kitagawa | H01L 35/30 |

FOREIGN PATENT DOCUMENTS

| | | |
|---|---|---|
| JP | 2005-051232 | 2/2005 |
| JP | 2011-091301 | 5/2011 |
| JP | 2011-166113 | 8/2011 |
| JP | 2014-192408 | 10/2014 |
| JP | 2015-126050 | 7/2015 |

OTHER PUBLICATIONS

Written Opinion for corresponding International Application No. PCT/JP2017/042423, dated Jan. 30, 2018.

* cited by examiner

RADIATOR FOR LIQUID COOLING TYPE COOLING DEVICE AND METHOD OF PRODUCING THE SAME

TECHNICAL FIELD

The present invention relates to a radiator used for a liquid cooling type cooling device for cooling a heating element composed of an electronic component, such as, e.g., a semiconductor element, and a method of producing such a radiator.

Note that in this specification and claims, upper and lower sides of FIG. 2 will be referred to as "upper" and "lower" sides.

BACKGROUND ART

The present applicant proposed a radiator for a liquid cooling type cooling device for cooling a power device (semiconductor element), such as, e.g., an IGBT (Insulated Gate Bipolar Transistor), used for a power conversion device to be mounted on, for example, an electric vehicle, a hybrid vehicle, a train, etc. (see Patent Document 1). The liquid cooling type cooling device is provided with a casing having a top wall, a bottom wall, and a peripheral wall. In the casing, a coolant passage in which a coolant flowed into the casing flows is provided. A heating element is attached to at least either one of the top wall outer surface and the bottom wall outer surface of the casing. In the liquid cooling type cooling device configured to cool the heating element by the coolant flowing through the coolant passage, a radiator which is arranged in the coolant passage in the casing radiates the heat emitted from the heating element to the coolant. The radiator is composed of a plurality of vertically elongated rectangular shaped fin plates arranged in parallel at intervals, and rod-shaped connecting members extending in a direction intersecting with the longitudinal direction of the fin plate and integrally connecting all the fin plates. All the fin plates are arranged at intervals in a thickness direction in a state in which the longitudinal direction of the fin plate is oriented in the flow direction of the coolant and the width direction of the fin plate is oriented in the vertical direction. At least one notch is formed in one side edge portion out of both side edge portions of the fin plate in the width direction. At least one notch is formed in the other side edge portion out of both side edge portions of the fin plate in the width direction at a position deviated from the notch of one side edge portion in the longitudinal direction of the fin plate. Connecting members are press-fitted into the notches of both side edge portions of all the fin plates so as not to protrude from the notches. Thus, all the fin plates are integrally connected by the connecting members.

In the case of the radiator described in Patent Document 1, however, since a rod-shaped connecting member is required, the number of parts increases.

The radiator described in Patent Document 1 is produced by the method including a first step, a second step, a third step, and a fourth step, which will be described below. The first step is a step of subjecting a metal blank plate to press working to punch out the metal blank plate to obtain a plurality of vertically elongated rectangular shaped fin plates having notches formed respectively in a portion close to the one end of one side edge portion in the width direction and a portion close to the other end of the other side edge portion in the width direction so that the longitudinal direction is oriented in the width direction of the metal blank plate and the width direction is oriented in the longitudinal direction of the metal blank plate in a half-punched state in which both end portions in the longitudinal direction are connected to the bridge portions via the connecting portions. A second step is a step of bending a portion of the bridge portion between adjacent fin plates into a substantially S-shape so as to orient the width direction of each of all the fin plates in the vertical direction. A third step is a step of press-fitting connecting members into notches formed in the longitudinal one end of one side edge portion of each of all the fin plates in the width direction and notches formed in the longitudinal other end of the other side edge portion of each of all the fin plates in the width direction. A fourth step is a step of separating all the fin plates from the bridge portions by cutting all the connecting portions which connect the fin plates to the bridge portion. Since the method requires the above-described four steps, the work is troublesome. Moreover, in the fourth step, all the connecting portions connecting the fin plates to the bridge portions are cut to separate all the fin plates from the bridge portions, so that the bridge portions are discarded. Therefore, the material yield is deteriorated. As a result, the production cost of the radiator increases.

PRIOR ART DOCUMENT

Patent Document

Patent Document 1: Japanese Unexamined Patent Application Publication No. 2015-126050

SUMMARY OF THE INVENTION

Problems to be Solved by the Invention

An object of the present invention is to solve the above-described problems and provide a radiator for a liquid cooling type cooling device capable of reducing the number of parts and the production cost and also provide a production method thereof.

The other objects and advantages of the present invention will be made apparent from the following preferred embodiments.

Means for Solving the Problems

The present invention has the following aspects in order to achieve the above-described objects.

(1) A radiator for a liquid cooling type cooling device, wherein the radiator is arranged in a coolant passage formed in a casing of a liquid cooling type cooling device to radiate heat emitted from a heating element to a coolant, and wherein the liquid cooling type device is provided with the casing having a top wall, a bottom wall, and a peripheral wall and a coolant passage through which the coolant flowed into the casing flows and is configured to cool the heating element mounted on at least either one of a top wall outer surface and a bottom wall outer surface of the casing by the coolant flowing through the coolant passage, the radiator comprising:
a plurality of vertically elongated rectangular shaped fin plates arranged in parallel at intervals; and
a connecting member integrally connecting all the fin plates,
wherein the fin plate includes:
a plate body in which a longitudinal direction is oriented in a flow direction of the coolant and a width direction is oriented in a vertical direction, the plate body being provided with flat plate-shaped portions at certain length portions close to both ends of the longitudinal direction; and a narrow portion integrally provided at each of both longitudinal end portions of the plate body so as to protrude outward from the longitudinal end portions in the longitudinal direction of the plate body and having both upper and lower ends positioned inner than both upper and lower side edges of the plate body in the width direction of the plate body, wherein all the fin plates are arranged at intervals in a thickness direction of the fin plate in a state in which the longitudinal direction of the plate body is oriented in the flow direction of the coolant and the width direction of the plate body is oriented in the vertical direction, wherein the connecting member is formed into a corrugated shape and composed of flat plate portions each integrated with the narrow portion of the plate body of the fin plate and arcuate portions each alternately connecting adjacent flat plate portions at upper and lower ends of the adjacent flat plate portions, wherein flat plate portions of the connecting member are arranged so that a longitudinal direction of the flat plate portion is oriented in the vertical direction and a thickness direction of the flat plate portion is oriented in the thickness direction of the plate body of the fin plate, wherein both the upper and lower ends of the connecting member are positioned inner than both the upper and lower ends of the plate body in the width direction of the plate body, wherein an intermediate portion of an upper arcuate portion of the connecting member protrudes upward and an intermediate portion of a lower arcuate portion of the connecting member protrudes downward, wherein the plate body and the narrow portion of the fin plate, and the flat plate portion of the connecting member are equal in thickness, and wherein both side surfaces of the flat plate-shaped portion of the plate body in the thickness direction, both side surfaces of the narrow portion in the thickness direction, and both side surfaces of the flat plate portion of the connecting member in the thickness direction are positioned on a same plane.

(2) The radiator for a liquid cooling type cooling device as recited in the above-described Item (1), wherein a reinforcing rib is integrally provided at at least either one side edge portion out of both the upper and lower side edge portions of the plate body of each of all the fin plates.

(3) The radiator for a liquid cooling type cooling device as recited in the above-described Item (2), wherein first reinforcing ribs inclined upward in a same direction are provided at upper side edge portions of the plate bodies of all the fin plates, and second reinforcing ribs inclined downward in a direction opposite to an inclination direction of the first reinforcing rib.

(4) The radiator for a liquid cooling type cooling device as recited in any one of the above-described Items (1) to (3), wherein the plate bodies of all the fin plates are each formed into a flat plate shape as a whole.

(5) The radiator for a liquid cooling type cooling device as recited in any one of the above-described Items (1) to (3), wherein a portion of the plate body of each of all the fin plates except for the flat plate-shaped portions is formed into a wave shape in a cross-sectional shape taken by cutting with a plane orthogonal to the width direction of the plate body so that the coolant flows in a serpentine manner between two adjacent fin plates.

(6) The radiator for a liquid cooling type cooling device as recited in any one of the above-described Items (1) to (5), wherein in the plate body of each fin plate, a plurality of through-holes are formed at intervals in the longitudinal direction of the plate body.

(7) A liquid cooling type cooling device provided with a casing having a top wall, a bottom wall, and a peripheral wall in which a coolant passage through which a coolant flows, wherein the casing includes an inlet header portion positioned upstream of the coolant passage and configured to allow the coolant to flow in, and an outlet header portion positioned downstream of the coolant passage and configured to allow the coolant to flow out, and wherein a radiator configured to radiate heat emitted from a heating element mounted on at least either one of a top wall outer surface of the casing or a bottom wall outer surface of the casing to the coolant flowing through the coolant passage is arranged in the coolant passage in the casing, wherein the radiator for a liquid cooling type cooling device as recited in any one of the above-described Items (1) to (6) is arranged so that the longitudinal direction of the plate body of the fin plate is oriented in a direction connecting the inlet header portion and the outlet header portion and the width direction of the plate body is oriented in the vertical direction, and wherein upper side edge portions of the plate bodies of all the fin plates are joined to the top wall of the casing and lower side edge portions of the plate bodies are joined to the bottom wall of the casing.

(8) A method of producing the radiator for a liquid cooling type cooling device as recited in the above-described Item (1), comprising:

a first step of forming a plurality of vertically elongated rectangular shaped fin plates each including a plate body and narrow portions integrated with bridge portions for forming connecting members that exist at both side edge portions of a metal blank plate in a width direction of the metal blank plate and arranged in a longitudinal direction of the metal blank plate by forming a plurality of linear slits extending in the width direction of the metal blank plate in the metal blank plate at intervals in the longitudinal direction of the metal blank plate by forming through-holes communicating with both ends of the slit, wherein the plate body is arranged so that a longitudinal direction of the plate body is oriented in a width direction of the metal blank plate, a width direction of the plate body is oriented in a longitudinal direction of the metal blank plate, and is provided with flat plate-shaped portions at certain length portions close to both ends of the longitudinal direction of the plate body, and wherein the narrow portions are integrated with both longitudinal end portions of the plate body so as to protrude outward from the longitudinal end portions in a longitudinal direction of the plate body and have both ends positioned inner than both side edges of the plate body in the width direction of the plate body; and a second step of forming a corrugated connecting member composed of a flat plate portion integrated with the narrow portion of the plate body of the fin plate and an arcuate portion alternately connecting adjacent flat plate portions at the both ends of the adjacent flat plate portions by bending the bridge portion into a corrugated shape so as to orient the width direction of the plate body of each of all the fin plates in the vertical direction.

(9) The method of producing the radiator for a liquid cooling type cooling device as recited in the above-described Item (8), wherein in the first step, first reinforcing ribs inclined outward in the width direction of the plate body in the same direction are provided at one side edge portion of the plate body in the width direction of the plate body, and second reinforcing ribs inclined outward in the width direction of the plate body in a direction opposite to an inclination direction of the first reinforcing rib are provided at the other side edge portion of the plate body in the width direction of the plate body.

(10) The method of producing the radiator for a liquid cooling type cooling device as recited in the above-described Item (8) or (9), wherein in the first step, a portion of the plate body of each of all the fin plates except for the flat plate-shaped portions is formed in a wave shape in cross-section taken by cutting with a plane orthogonal to the width direction of the plate body.

(11) The method of producing the radiator for a liquid cooling type cooling device as recited in any one of the above-described Items (8) to (10), wherein in the first step, a plurality of through-holes are formed in the plate body of each of all the fin plates at intervals in the longitudinal direction of the plate body.

Effects of the Invention

According to the radiator for a liquid cooling type cooling devices as recited in the above-described Items (1) to (6), the radiator includes a plurality of vertically elongated rectangular shaped fin plates arranged in parallel at intervals, and a connecting member integrally connecting all the fin plates. The fin plate includes a plate body in which a longitudinal direction is oriented in a flow direction of the coolant and a width direction is oriented in a vertical direction, the plate body being provided with flat plate-shaped portions at certain length portions close to both ends of the longitudinal direction, and a narrow portion integrally provided at each of both longitudinal end portions of the plate body so as to protrude outward from the end portion in the longitudinal direction of the plate body and having both upper and lower ends positioned inner than both upper and lower side edges of the plate body in the width direction of the plate body. All the fin plates are arranged at intervals in a thickness direction of the fin plate in a state in which the longitudinal direction of the plate body is oriented in the flow direction of the coolant and the width direction of the plate body is oriented in the vertical direction. The connecting member is formed into a corrugated shape and composed of flat plate portions each integrated with the narrow portion of the plate body of the fin plate and arcuate portions each alternately connecting adjacent flat plate portions at upper and lower ends of the adjacent flat plate portions. Therefore, no member for connecting all the fin plates will be required. This makes it possible to reduce the number of parts and eliminate the work for connecting all the fin plates using separately prepared members, resulting in a simplified production work. Further, it becomes possible to make the thickness and the shape of all the fin plates to be a thickness and a shape effective for improving cooling performance.

Further, the flat plate portion of the connecting member is arranged so that the longitudinal direction thereof is oriented in the vertical direction and the thickness direction thereof is oriented in the thickness direction of the plate body of the fin plate, both the upper and lower ends of the connecting member are positioned inner than both the upper and lower ends of the plate body in the width direction of the plate body. The plate body and the narrow portion of the fin plate, and the flat plate portion of the connecting member are equal in thickness. Both side surfaces of the flat plate-shaped portion of the plate body in the thickness direction, both side surfaces of the narrow portion in the thickness direction, and both side surfaces of the flat plate portion of the connecting member in the thickness direction are positioned on the same plane. Therefore, the flat plate portion of the connecting member does not obstruct the flow of the coolant at the coolant passage formed between adjacent fin plates, which makes it possible to suppress the increase of the flow resistance in the coolant passage.

According to the radiator for a liquid cooling type cooling device as recited in the above-described Item (2), the strength of the fin plate increases, which can suppress the occurrence of deflection and/or waving of the fin plate.

According to the above-described radiator for a liquid cooling type cooling device as recited in the above-described Item (3), it becomes possible to reduce the pitch between adjacent fin plates, resulting in improved heat radiation performance.

In the liquid cooling type cooling device using the radiator for a liquid cooling type cooling device as recited in the above-described Item (5), the coolant flows in a serpentine manner along the fin plates between two adjacent fin plates. This effectively increases the area in the fin plate effective for heat transfer, which in turn can improve the cooling performance.

In the liquid cooling type cooling device using the radiator for a liquid cooling type cooling device as recited in the above-described Item (6), the coolants are mixed via all the coolant passages formed between adjacent fin plates. Therefore, even in cases where the temperature of the coolant flowing through a part of all the coolant passages rises, the temperature of the entire coolant is uniformed.

According to the liquid cooling type cooling device as recited in the above-described Item (7), at the time of the production, all the fin plates of the radiator are integrally connected by the connecting member. Therefore, the handling of all the fin plates improves, resulting in a simplified production work.

According to the method of producing the radiator for a liquid cooling type cooling device as recited in the above-described Item (8), the method includes two steps, and therefore the number of steps is reduced as compared with the method described in Patent Document 1. Moreover, since the bridge portion is served as a connecting member, parts to be discarded from the metal blank plate are reduced, which improves the material yield. Therefore, the production cost of the radiator is reduced.

According to the method of producing the radiator for a liquid cooling type cooling device as recited in the above-described Item (9), at the time of bending the bridge portion into a corrugated shape in the second step, there is no interference between both the reinforcing ribs of the plate bodies of the adjacent fin plates. This makes it possible to reduce the pitch between adjacent fin plates of the produced radiator, which improves the heat radiation performance.

In the liquid cooling type cooling device using the radiator produced by the above-described method as recited in the above-described Item (10), the coolant flows in a serpentine manner along the fin plates between two adjacent fin plates.

This effectively increases the area in the fin plate effective for heat transfer, which in turn can improve the cooling performance.

In the liquid cooling type cooling device using the radiator produced by the above-described method as recited in the above-described Item (11), the coolants are mixed via all the coolant passages formed between adjacent fin plates. Therefore, even in cases where the temperature of the coolant flowing through a part of all the coolant passages rises, the temperature of the entire coolant is uniformed.

EMBODIMENT FOR CARRYING OUT THE INVENTION

Hereinafter, some embodiments of the present invention will be described with reference to the drawings.

Note that the same symbol will be allotted to the same item and the same portion throughout the drawings.

In this specification, note that the term "aluminum" includes the meaning of aluminum alloy in addition to pure aluminum.

Also note that in the following description, the left and right sides of FIG. 2 will be referred to as left and right sides, respectively, and the upper side of FIG. 3 will be referred to as a front side and the opposite side will be referred to as a rear side.

Figure 1:
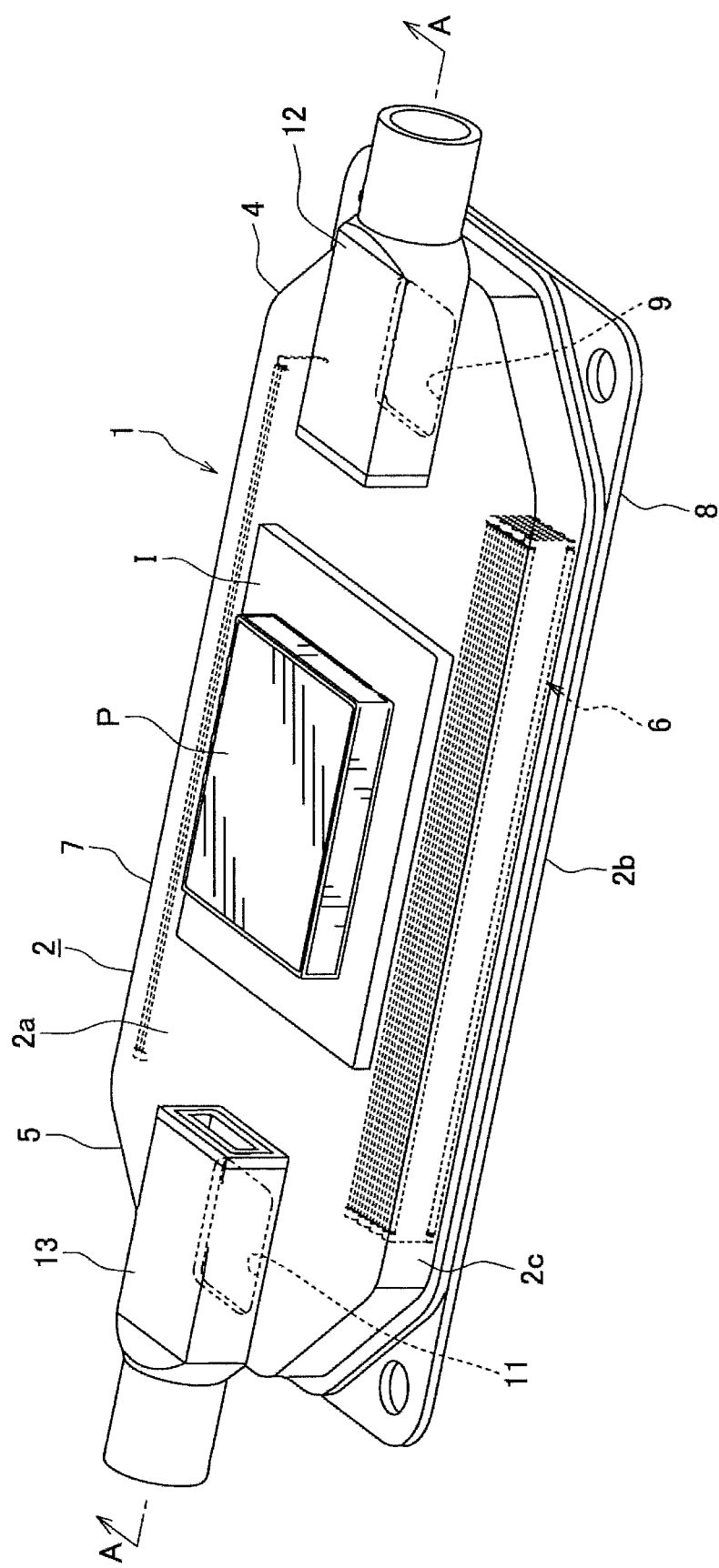
FIG. 1 is a perspective view showing an overall configuration of a liquid cooling type cooling device using a radiator for a liquid cooling type cooling device according to the present invention.
Figure 2:
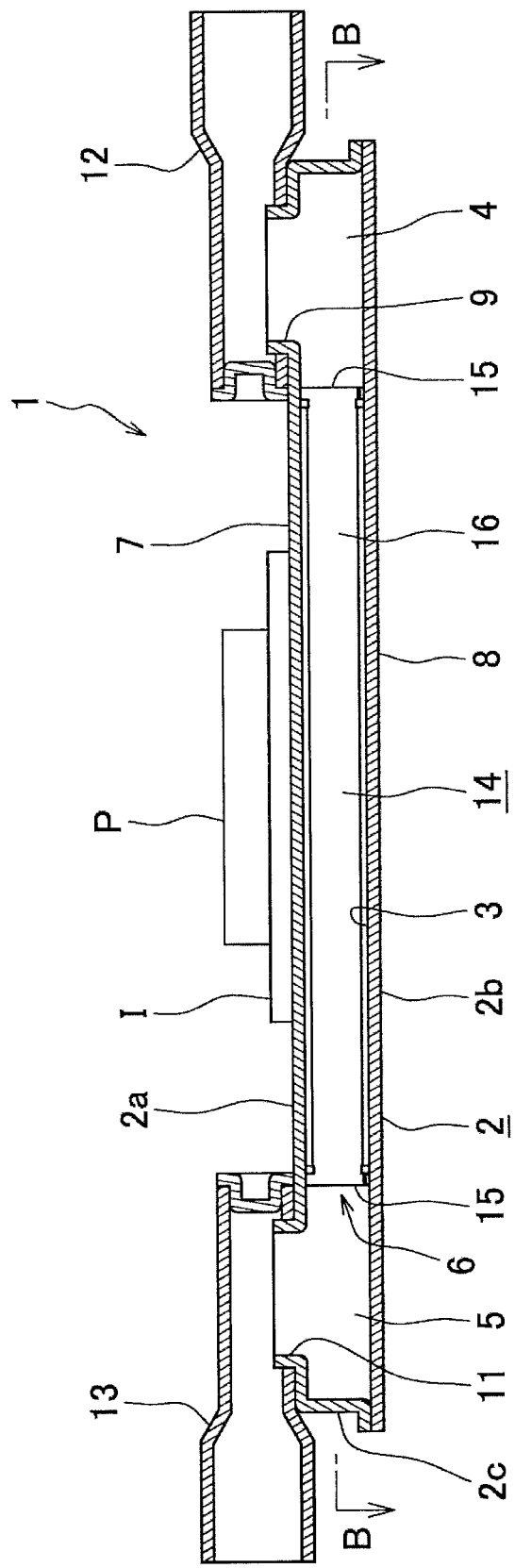
FIG. 2 is a cross-sectional view taken along the line A-A of FIG. 1.
Figure 3:
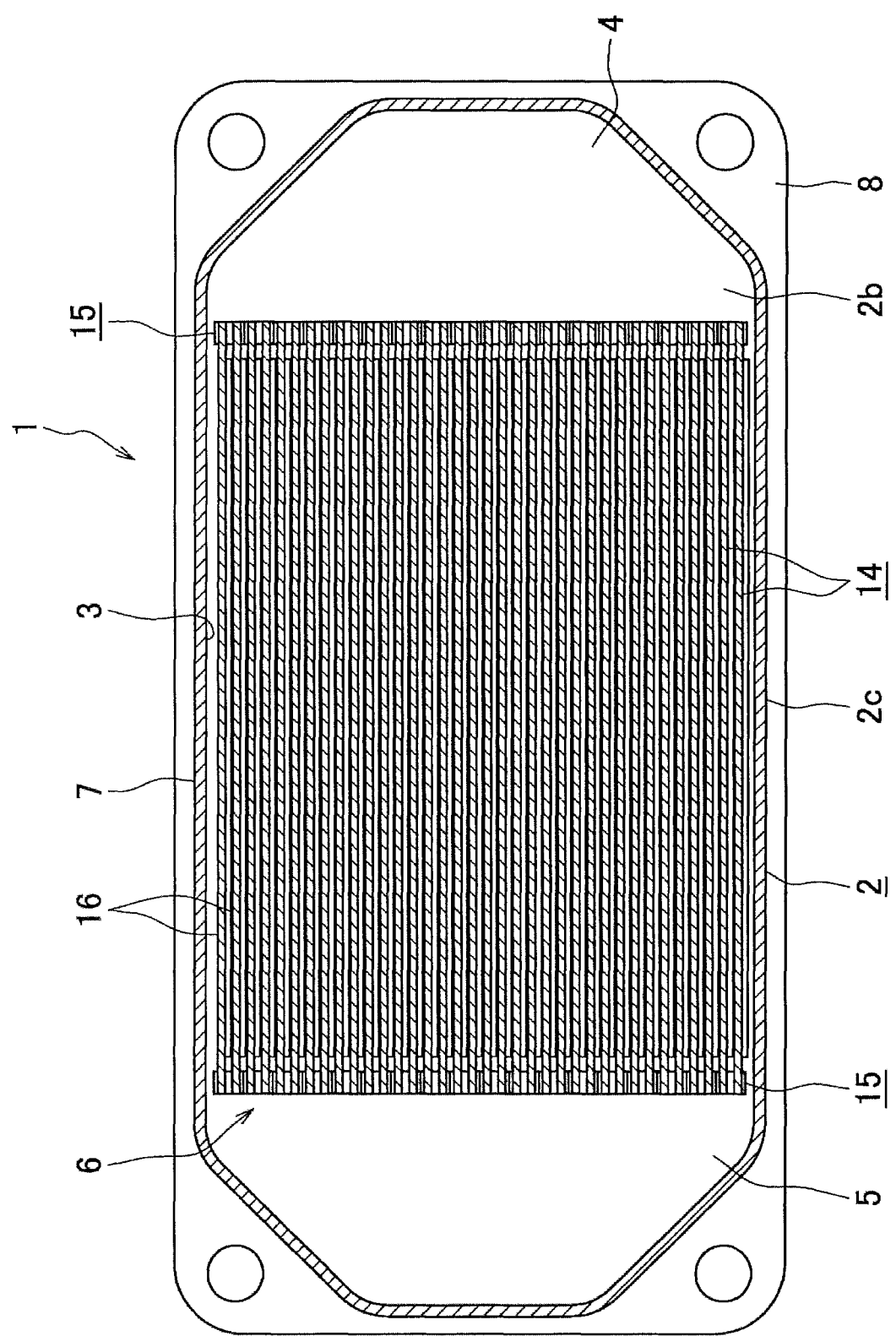
FIG. 3 is a cross-sectional view taken along the line B-B of FIG. 2.
Figure 4:
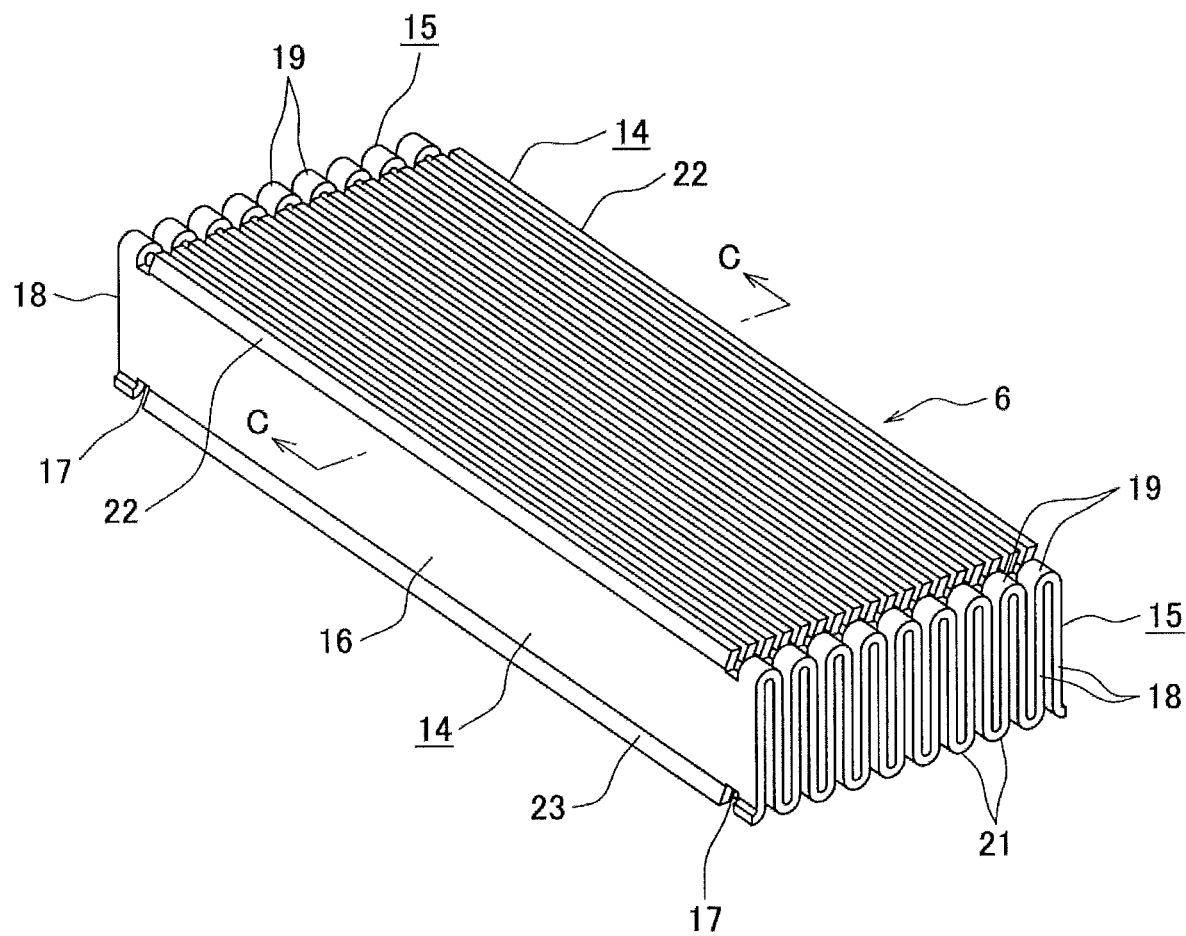
FIG. 4 is a perspective view showing a part of a radiator used for the liquid cooling type cooling device shown in FIG. 1.
Figure 5:
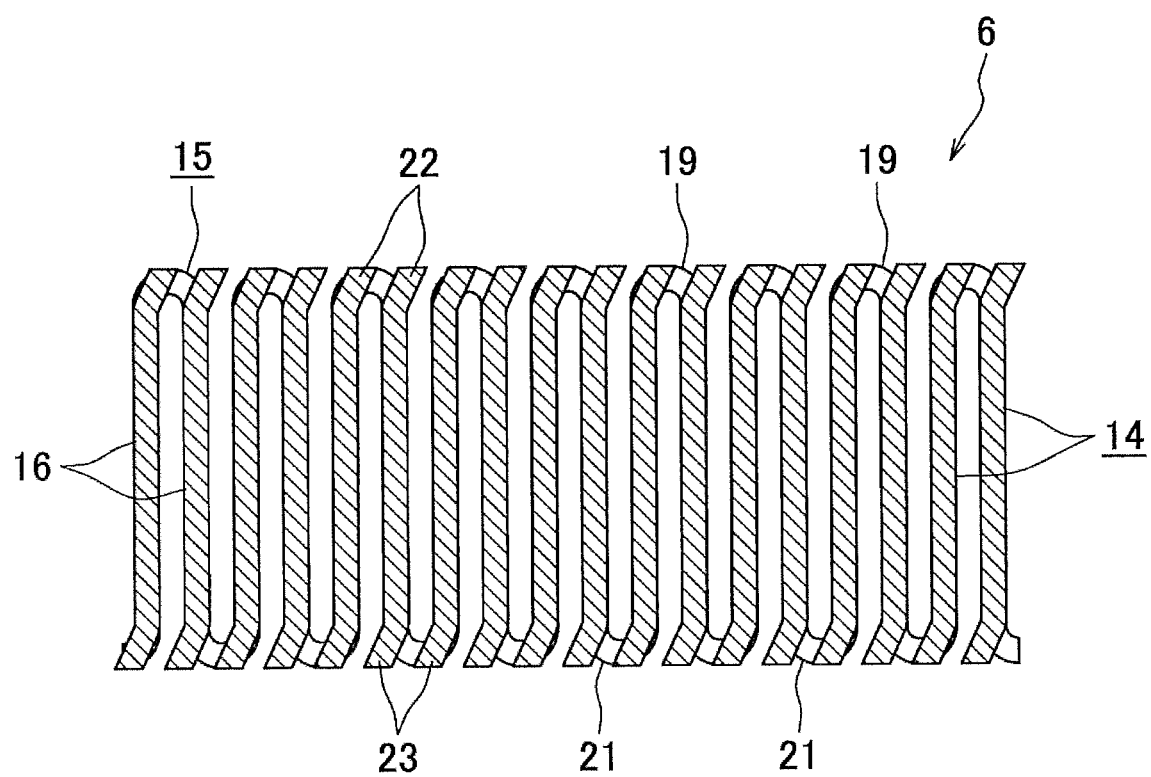
FIG. 5 is an enlarged cross-sectional view taken along the line C-C of FIG. 4.
Figure 6:
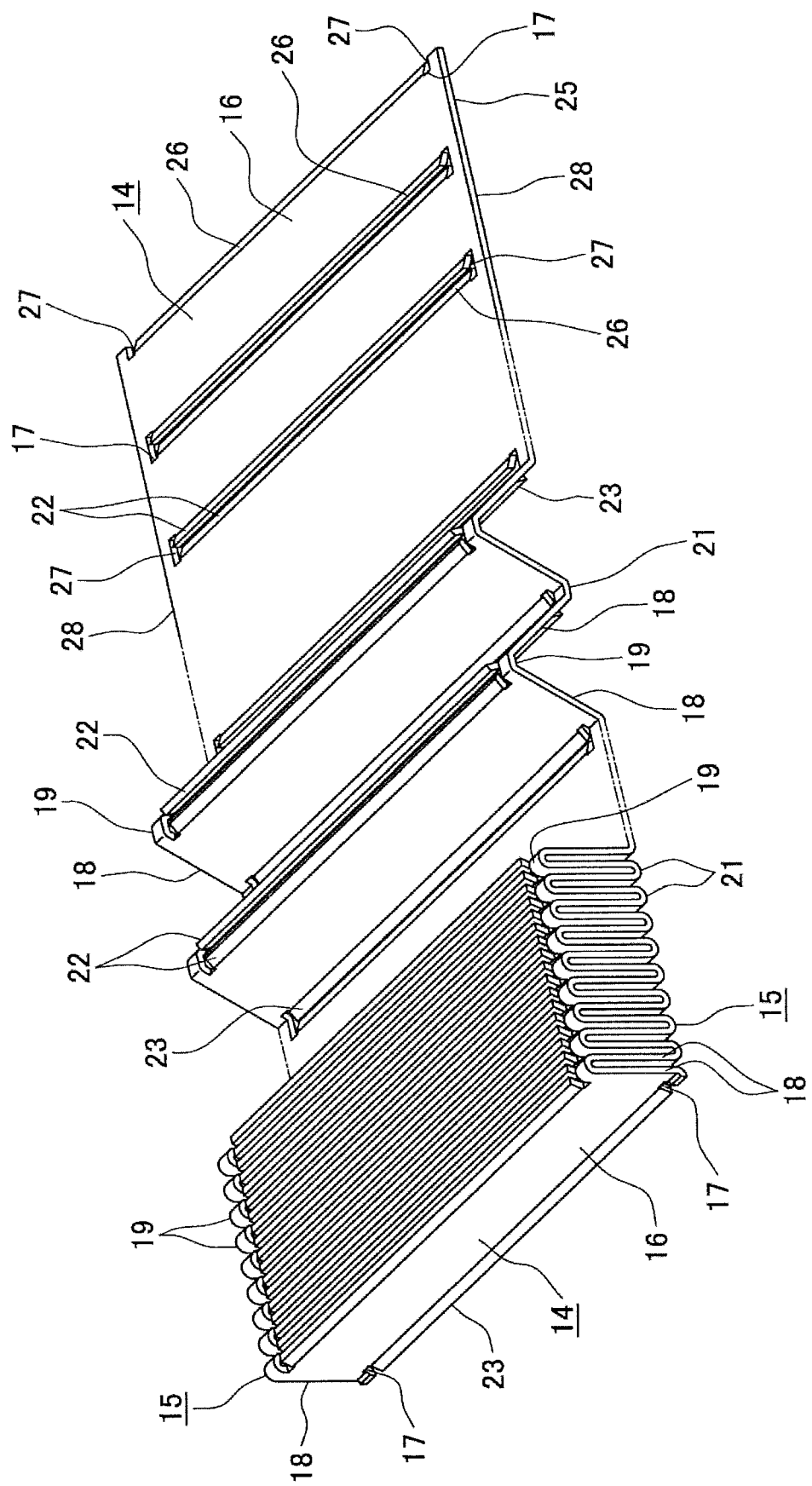
FIG. 6 is a partial perspective view showing a first step and a second step of a method of producing the radiator used for the liquid cooling type cooling device shown in FIG. 1.

FIG. 1 to FIG. 3 show an overall structure of a liquid cooling type cooling device using a radiator according to the present invention. FIG. 4 and FIG. 5 show a radiator for a liquid cooling type cooling device according to the present invention. FIG. 6 shows a method of producing a radiator for a liquid cooling type cooling device according to the present invention.

In FIG. 1 to FIG. 3, a liquid cooling type cooling device 1 is provided with a casing 2 having a top wall 2a, a bottom wall 2b, and a peripheral wall 2c. In the casing 2, a coolant passage 3 in which a coolant flows from one side (right side) to the other side (left side) of the longitudinal direction of the casing 2, an inlet header portion 4 positioned upstream (right) of the coolant passage 3 and into which the coolant flows, and an outlet header portion 5 positioned downstream (left side) of the coolant passage 3 and from which the coolant flows out are provided. In the coolant passage 3 in the casing 2, an aluminum radiator 6 is arranged. The aluminum radiator 6 is configured to radiate heat generated from a heating element P attached to at least one of the outer surface of the top wall 2a of the casing 2 and the outer surface of the bottom wall 2b of the casing 2 (the top wall 2a in the illustrated embodiment) to the coolant flowing through the coolant passage 3.

The casing 2 is formed by joining a downwardly opened box-shaped aluminum upper component 7 constituting the top wall 2a and the peripheral wall 2c to a plate-shaped aluminum lower component 8 constituting the bottom wall 2b with a brazing material (hereinafter, joining with a brazing material will be referred to as "brazing"). The upper component 7 and the lower component 8 are each formed using an aluminum brazing sheet having a brazing material layer on at least one surface so that the brazing material layer is positioned inside the casing 2.

The inlet header portion 4 and the outlet header portion 5 in the casing 2 extend in the width direction (front and rear direction) of the coolant passage 3. A coolant inlet 9 communicated with the inlet header portion 4 is formed in a portion of the top wall 2a of the casing 2 close to one end (the right end) which is a central portion of the top wall 2a in the front and rear direction. A coolant outlet 11 communicated with the outlet header portion 5 is formed in a portion of the top wall 2a of the casing 2 close to the other end (the left end) which is a central portion of the top wall 2a in the front and rear direction. An aluminum inlet pipe 12 for feeding a coolant into the inlet header portion 4 through the coolant inlet 9 and an aluminum outlet pipe 13 for discharging the coolant from the inside of the outlet header portion 5 through the coolant outlet 11 are brazed to the top wall 2a of the casing 2.

The heating element P is, for example, a power device such as an IGBT, an IGBT module in which an IGBT is integrated with a control circuit and housed in the same package, an intelligent power module in which a protection circuit is further integrated with the IGBT module and housed in the same package, and is attached to the outer surface of the top wall of the casing 2 via the insulating member I.

As shown in FIG. 4 and FIG. 5, the radiator 6 is composed of a plurality of aluminum vertically elongated rectangular shaped fin plates 14 arranged in parallel with a space therebetween and connecting members 15 integrated with the fin plates 14 to integrally connect all the fin plates 14.

The fin plate 14 is composed of a plate body 16 and narrow portions 17. The longitudinal direction of the plate body 16 is oriented in the flow direction (right and left direction) of the coolant in the coolant passage 3. The width direction of the plate body 16 is oriented in the vertical direction. The plate body 16 is entirely formed in a flat plate-shaped portion. The narrow portions 17 are integrally provided on both longitudinal end portions of the plate body 16 so as to protrude from the longitudinal end portions to the outside in the longitudinal direction of the plate body 16. Both the upper and lower ends of the narrow portion 17 are positioned inner than both the upper and lower side ends of the plate body 16 in the width direction of the plate body 16. All the fin plates 14 are arranged so that the plate bodies 16 are arranged in parallel at intervals in the thickness direction thereof. The space between adjacent plate bodies 16 and narrow portions 17 of the two fin plates 14 of the radiator 6 and the space between the plate body 16 and the narrow portion 17 of the fin plates 14 at both ends and the front and rear side portions of the peripheral wall 2c of the casing 2 are each served as a split flow passage through which the coolant flows.

The connecting member 15 is formed in a corrugated shape and composed of flat plate portions 18 each integrated with the narrow portion 17 of the plate body 16 of each of all the fin plates 14 and arcuate portions 19 and 21 connecting adjacent flat plate portions 18 alternately at the upper end and the lower end. In the flat plate portion 18 of the connecting member 15, the longitudinal direction is oriented in the vertical direction, the thickness direction is oriented in the thickness direction of the plate body 16 of the fin plate 14, and the upper and lower ends are positioned inner than the upper and lower ends of the plate body 16 in the width direction of the plate body 16. The intermediate portion of the upper arcuate portion 19 of the connecting member 15 in the front and rear direction (the thickness direction of the plate body 16) protrudes upward, and an intermediate portion of the lower arcuate portion 21 in the front and rear direction protrudes downward. The plate body 16 and the narrow portion 17 of the fin plate 14, and the flat plate portion 18 of the connecting member 15 are equal in thickness. Both side surfaces of the plate body 16 in the thickness direction, both side surfaces of the narrow portion 17 in the thickness direction, and both side surfaces of the flat plate portion 18 of the connecting member 15 in the thickness direction are positioned on the vertical same plane.

At the upper side edge portions of the plate bodies 16 of all fin plate 14, first reinforcing ribs 22 inclined upward in the same direction (forward) are provided. In the same manner, at the lower side edge portions, second reinforcing ribs 23 inclined downward in a direction opposite to the inclination direction of the first reinforcing rib 22 are integrally provided. In the first reinforcing ribs 22 of all the fin plates 14, the upper side edge portions thereof are brazed to the inner surface of the portion forming the top wall 2a of the upper component 7 of the casing 2. The second reinforcing ribs 23 are brazed to the inner surface of the portion forming the bottom wall 2b of the lower component 8 of the casing 2.

In the liquid cooling type cooling device 1 of the above-described configuration, the coolant flowed into the inlet header portion 4 from the inlet pipe 12 via the coolant inlet 9 flows into respective split flow passages each formed between adjacent two fin plates 14 of the radiator 6 arranged in the coolant passage 3, and flows leftward in respective split flow passages. The coolants flowed leftward through the split flow passages of the coolant passage 3 enter the outlet header portion 5 and is sent out by the outlet pipe 13 via the coolant outlet 11.

The heat generated from the heating element P is radiated to the coolant flowing in each split flow passage of the coolant passage 3 via the insulating member I, the top wall 2a of the casing 2, and each fin plate 14 of the radiator 6, so that the heating element P is cooled.

Next, a method of producing the radiator 6 will be described with reference to FIG. 6.

First, with press working or the like, a plurality of linear slits 26 extending in a width direction of an aluminum blank plate 25 is formed in the blank plate 25 rewound from a coil material at intervals in the longitudinal direction of the blank plate 25. Further, through-holes 27 communicating with both ends of the slit 26 are formed in the aluminum blank plate 25 so that a plurality of vertically elongated rectangular shaped fin plates 14 between adjacent slits 26 are provided so as to be integrated with bridge portions 28 for forming the connecting members that exist at both side edge portions of the blank plate 25 in the width direction of the blank plate 25 and arranged in the longitudinal direction of the blank plate 25. The fin plate 14 includes a plate body 16 in which the longitudinal direction of the plate body 16 is oriented in the width direction of the blank plate 25, the width direction of the plate body 16 is oriented in the longitudinal direction of the blank plate 25, and the entirety of the plate body 16 is formed of a flat plate-shaped portion. The narrow portion 17 is integrally provided at each of both longitudinal end portions of the plate body 16 so as to protrude outward from the longitudinal end portions in the longitudinal direction of the plate body 16, and has both end portions positioned inner than both side ends of the plate body 16 in the width direction of the plate body 16. (First Step)

In the first step, a first reinforcing rib 22 is formed on one side edge portion of the plate body 16, and a second reinforcing rib 23 is formed on the other side edge portion of the plate body 16. The first reinforcing ribs 22 are provided at the side edge portions of adjacent two plate bodies 16 of the fin plates 14 arranged in the longitudinal direction of the blank plate 25 via the slit 26 so as to incline outward in the width direction in opposite directions. The second reinforcing ribs 23 are provided at the side edge portions of adjacent two plate bodies 16 of the fin plates 14 arranged in the longitudinal direction of the blank plate 25 via the slit 26 so as to incline outward in the width direction in opposite directions. That is, in the plate bodies 16 of the two fin plates 14 adjacently arranged in the longitudinal direction of the blank plate 25, the first reinforcing rib 22 inclined in either one of upward and downward directions so as to extend outward in the width direction is provided at the side edge portion facing the slit 26 of one of the plate bodies 16. Further, the first reinforcing rib 22 inclined in either the other of downward and upward directions so as to extend outward in the width direction is provided at the side edge portion facing the slit 26 of the other plate body 16. Further, at the side edge portions of both the plate bodies 16 opposite to the side edge portions provided with the first reinforcing ribs 22, the second reinforcing ribs 23 inclined in a direction opposite to the inclination direction of the first reinforcing rib 22 so as to extend outward in the width direction is provided.

Then, the bridge portion 28 is bent into a corrugated shape to thereby form a connecting member 15 composed of a flat plate portion 18 in which the longitudinal direction of the flat plate portion 18 is oriented in the vertical direction and the arcuate portion 19 and 21 alternately connecting the adjacent flat plate portions 18 at both ends of the flat plate portion 18 in the longitudinal direction of the blank plate 25 so as to orient the width direction of the plate body 16 of each of all the fin plates 14 in the vertical direction (Second Step). Lastly, a portion including the required number of fin plates 14 in the blank plate 25 is cut to thereby produce a radiator 6.

Figure 7:
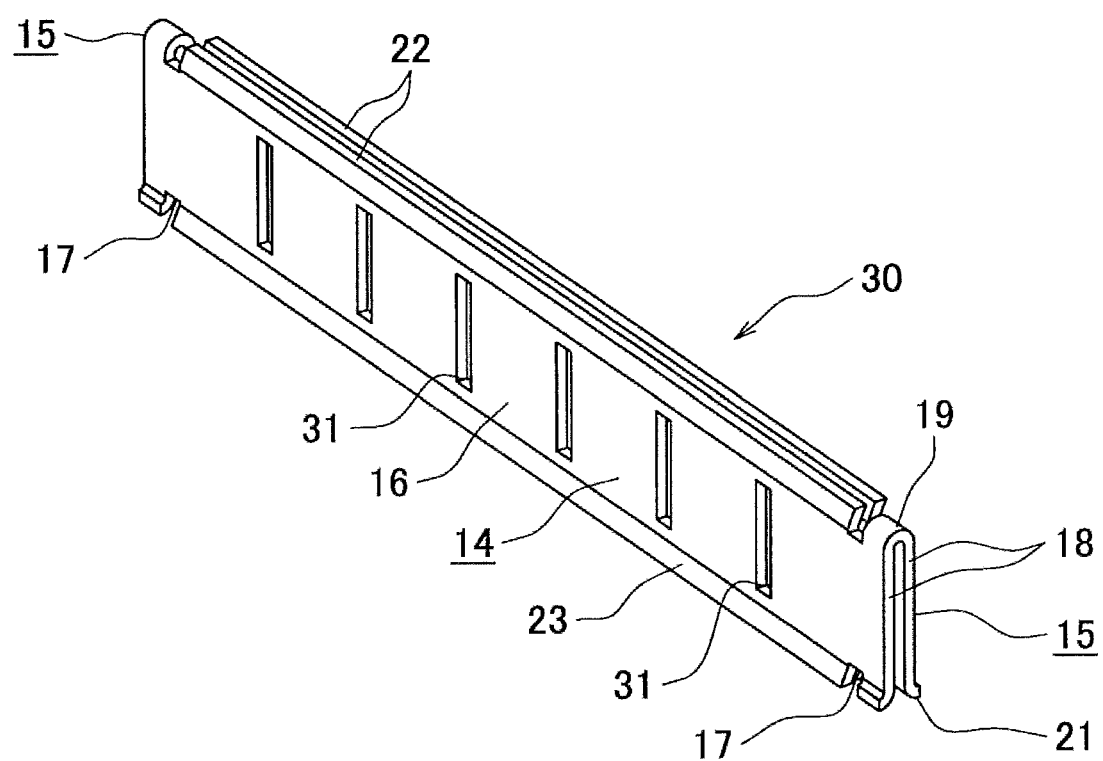
FIG. 7 is a perspective view showing a part of a first modified embodiment of the radiator for a liquid cooling type cooling device of the present invention.
Figure 8:
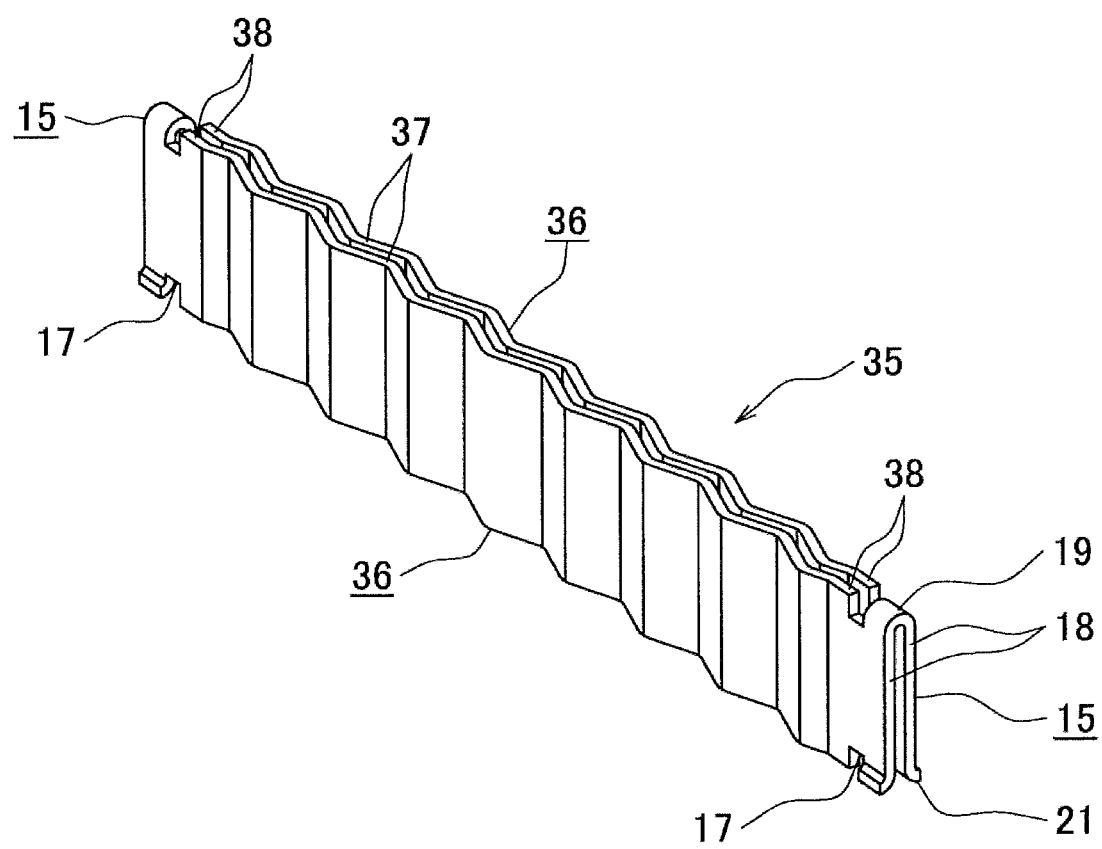
FIG. 8 is a perspective view showing a part of a second modified embodiment of the radiator for a liquid cooling type cooling device of the present invention.
Figure 9:
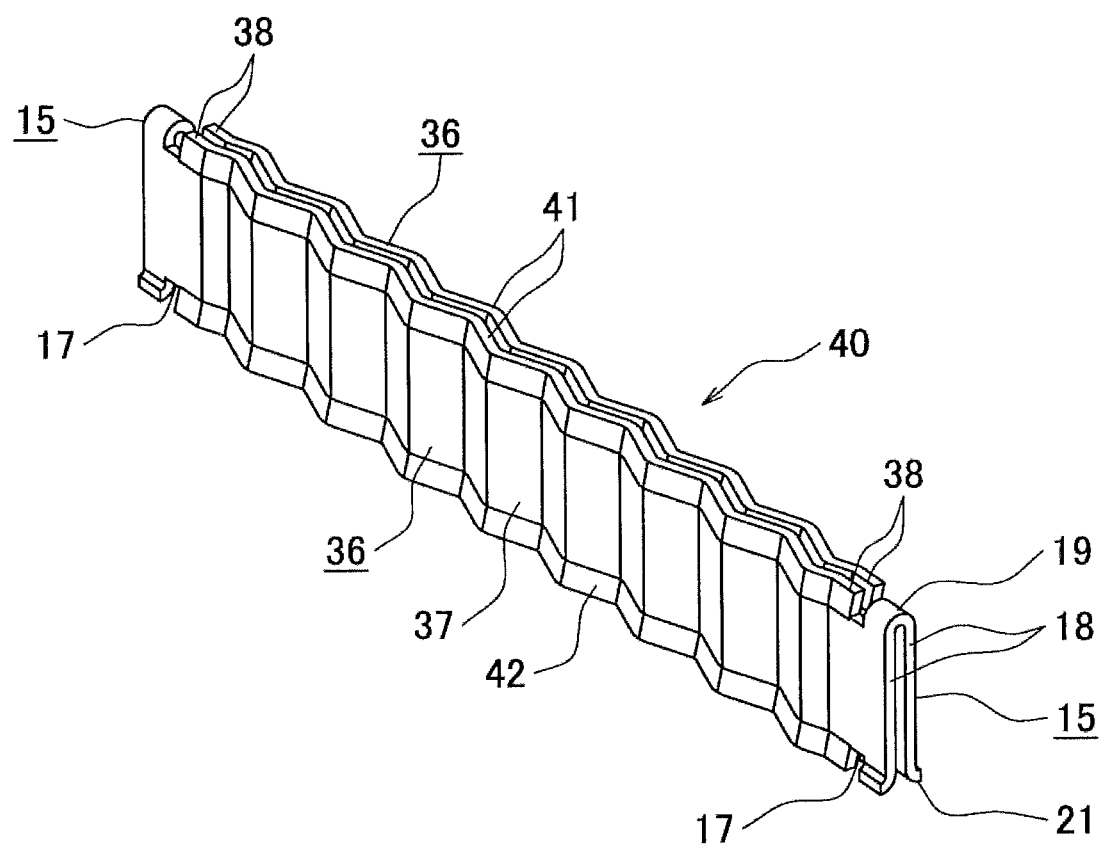
FIG. 9 is a perspective view showing a part of a third modified embodiment of the radiator for a liquid cooling type cooling device of the present invention.

FIG. 7 to FIG. 9 show a modified embodiment of a radiator for a liquid cooling type cooling device according to the present invention.

In the case of the radiator 30 shown in FIG. 7, a plurality of through-holes 31 extending in the width direction of the plate body 16 are formed in the plate body 16 of the fin plate 14 at intervals in the longitudinal direction of the plate body 16.

The other configurations are the same as those of the radiator 6 shown in FIG. 4 and FIG. 5.

In the case of the radiator 35 shown in FIG. 8, the plate body 37 each of all the fin plates 36 has flat plate-shaped portions 38 only at fixed length portions closed to both longitudinal ends. The portion of the plate body 37 excluding the flat plate-shaped portions 38 is formed in a wave shape in cross-section taken by cutting with a plane orthogonal to the width direction. Therefore, the coolant flows in a serpentine manner between two adjacent fin plates 36. Note that no reinforcing ribs are provided at both the upper and lower side edge portions of the plate body 37.

The other configurations are the same as those of the radiator 6 shown in FIG. 4 and FIG. 5.

In the case of the radiator 40 shown in FIG. 9, at the upper side edge portions of the plate bodies 37 of all the fin plates 36, first reinforcing ribs 41 are provided so as to be upwardly inclined in the same direction (forward). Similarly, at the lower side edge portions of the plate bodies 37, second reinforcing ribs 42 are integrally provided so as to be downwardly inclined in a direction opposite to the inclination direction of the first reinforcing rib 41.

The other configurations are the same as those of the radiator 35 shown in FIG. 8.

In the plate body 37 of the fin plate 36 of each of the radiators 35 and 40 shown in FIG. 8 and FIG. 9, a plurality of through-holes extending in the width direction of the plate body 37 may be formed at intervals in the longitudinal direction of the plate body 37.

The present application claims priority to Japanese Patent Application No. 2016-254684 filed on Dec. 28, 2016, the entire disclosure of which is incorporated herein by reference in its entirety.

It should be understood that the terms and expressions used herein are used for explanation and have no intention to be used to construe in a limited manner, do not eliminate any equivalents of features shown and mentioned herein, and allow various modifications falling within the claimed scope of the present invention.

INDUSTRIAL APPLICABILITY

The radiator for a liquid cooling type cooling device according to the present invention is suitably used for a liquid cooling type cooling device for cooling a power device, such as, e.g., an IGBT used for a power conversion device to be mounted on an electric vehicle, a hybrid vehicle, a train, or the like.

DESCRIPTION OF REFERENCE SYMBOLS

1: liquid cooling type cooling device
2: casing
2a: top wall
2b: bottom wall
2c: peripheral wall
3: coolant passage
6, 30, 35, 40: radiator
14, 36: fin plate
15: connecting member
16, 37: plate body
17: narrow portion
18: flat plate portion
19, 21: arcuate portion
22, 41: first reinforcing rib
23, 42: second reinforcing rib
25: blank plate
26: slit
27: through-hole
28: bridge portion
P: heating element

The invention claimed is:

1. A radiator for a liquid cooling type cooling device, wherein the radiator is arranged in a coolant passage formed in a casing of the liquid cooling type cooling device to radiate heat emitted from a heating element to a coolant, and wherein the liquid cooling type device is provided with the casing having a top wall, a bottom wall, and a peripheral wall and the coolant passage through which the coolant flowed into the casing flows and is configured to cool the heating element mounted on at least either one of an outer surface of the top wall and an outer surface of the bottom wall of the casing by the coolant flowing through the coolant passage, the radiator comprising:
a plurality of vertically elongated rectangular shaped fin plates arranged in parallel at intervals; and
a connecting member integrally connecting all the fin plates,
wherein the fin plate includes:
a plate body in which a longitudinal direction is oriented in a flow direction of the coolant and a width direction is oriented in a vertical direction, the plate body being provided with flat plate-shaped portions at certain length portions close to both ends of the longitudinal direction; and
a narrow portion integrally provided at each of both longitudinal end portions of the plate body so as to protrude outward from the longitudinal end portions in the longitudinal direction of the plate body and having both upper and lower ends positioned inner than both upper and lower side edges of the plate body in the width direction of the plate body,
wherein all the fin plates are arranged at intervals in a thickness direction of the fin plate in a state in which the longitudinal direction of the plate body is oriented in the flow direction of the coolant and the width direction of the plate body is oriented in the vertical direction,
wherein the connecting member is formed into a corrugated shape and composed of flat plate portions each integrated with the narrow portion of the plate body of the fin plate and arcuate portions each alternately connecting adjacent flat plate portions at upper and lower ends of the adjacent flat plate portions,
wherein the flat plate portions of the connecting member are arranged so that a longitudinal direction of the flat plate portion is oriented in the vertical direction and a thickness direction of the flat plate portion is oriented in the thickness direction of the plate body of the fin plate,
wherein both the upper and lower ends of the connecting member are positioned inner than both the upper and lower ends of the plate body in the width direction of the plate body,
wherein an intermediate portion of an upper arcuate portion of the connecting member protrudes upward and an intermediate portion of a lower arcuate portion of the connecting member protrudes downward,
wherein the plate body and the narrow portion of the fin plate, and the flat plate portion of the connecting member are equal in thickness, and
wherein both side surfaces of the flat plate-shaped portion of the plate body in the thickness direction, both side surfaces of the narrow portion in the thickness direction, and both side surfaces of the flat plate portion of the connecting member in the thickness direction are positioned on a same plane.

2. The radiator for a liquid cooling type cooling device as recited in claim 1,
wherein a reinforcing rib is integrally provided at at least either one side edge portion of both the upper and lower side edge portions of the plate body of all the fin plates.

3. The radiator for a liquid cooling type cooling device as recited in claim 2,
wherein first reinforcing ribs inclined upward in a same direction are provided at upper side edge portions of the plate bodies of all the fin plates, and second reinforcing ribs inclined downward in a direction opposite to an inclination direction of the first reinforcing rib.

4. The radiator for a liquid cooling type cooling device as recited in claim 1,
wherein the plate bodies of all the fin plates are each formed into a flat plate shape as a whole.

5. The radiator for a liquid cooling type cooling device as recited in claim 1,
wherein a portion of the plate body of each of all the fin plates except for the flat plate-shaped portions is formed into a wave shape in a cross-sectional shape taken by cutting with a plane orthogonal to the width direction of the plate body so that the coolant flows in a serpentine manner between two adjacent fin plates.

6. The radiator for a liquid cooling type cooling device as recited in claim 1,
wherein in the plate body of each fin plate, a plurality of through-holes are formed at intervals in the longitudinal direction of the plate body.

7. A liquid cooling type cooling device provided with the casing having the top wall, the bottom wall, and the peripheral wall in which the coolant passage through which the coolant flows, wherein the casing includes an inlet header portion positioned upstream of the coolant passage and configured to allow the coolant to flow in, and an outlet header portion positioned downstream of the coolant passage and configured to allow the coolant to flow out, and wherein the radiator configured to radiate heat emitted from the heating element mounted on at least either one of the outer surface of the top wall of the casing or the outer surface of the bottom wall of the casing to the coolant flowing through the coolant passage is arranged in the coolant passage in the casing,
wherein the radiator for the liquid cooling type cooling device as recited in claim 1 is arranged so that the longitudinal direction of the plate body of the fin plate is oriented in a direction connecting the inlet header portion and the outlet header portion and the width direction of the plate body is oriented in the vertical direction, and
wherein upper side edge portions of the plate bodies of all the fin plates are joined to the top wall of the casing and lower side edge portions of the plate bodies are joined to the bottom wall of the casing.

8. A method of producing the radiator for a liquid cooling type cooling device as recited in claim 1, comprising:
a first step of forming the plurality of vertically elongated rectangular shaped fin plates each including the plate body and narrow portions integrated with bridge portions for forming connecting members that exist at both side edge portions of a metal blank plate in a width direction of the metal blank plate and arranged in a longitudinal direction of the metal blank plate by forming a plurality of linear slits extending in the width direction of the metal blank plate in the metal blank plate at intervals in the longitudinal direction of the metal blank plate by forming through-holes communicating with both ends of the slit, wherein the plate body is arranged so that the longitudinal direction of the plate body is oriented in the width direction of the metal blank plate, the width direction of the plate body is oriented in the longitudinal direction of the metal blank plate, and is provided with the flat plate-shaped portions at certain length portions close to the both ends of the longitudinal direction of the plate body, and wherein the narrow portions are integrated with both longitudinal end portions of the plate body so as to protrude outward from the longitudinal end portions in the longitudinal direction of the plate body and have both ends of the narrow portions positioned inner than both side edges of the plate body in the width direction of the plate body; and
a second step of forming the connecting member having the corrugated shape and composed of the flat plate portion integrated with the narrow portion of the plate body of the fin plate and the arcuate portion alternately connecting the adjacent flat plate portions at both ends of the adjacent flat plate portions by bending the bridge portion into a corrugated shape so as to orient the width direction of the plate body of each of all the fin plates in the vertical direction.

9. The method of producing the radiator for a liquid cooling type cooling device as recited in claim 8,
wherein in the first step,
first reinforcing ribs inclined outward in the width direction of the plate body in the same direction are provided at one side edge portion of the plate body in the width direction of the plate body, and
second reinforcing ribs inclined outward in the width direction of the plate body in a direction opposite to an inclination direction of the first reinforcing rib are provided at the other side edge portion of the plate body in the width direction of the plate body.

10. The method of producing the radiator for a liquid cooling type cooling device as recited in claim 8,
wherein in the first step,
a portion of the plate body of each of all the fin plates except for the flat plate-shaped portions is formed in a wave shape in cross-section taken by cutting with a plane orthogonal to the width direction of the plate body.

11. The method of producing the radiator for a liquid cooling type cooling device as recited in claim 8,
wherein in the first step,
a plurality of through-holes are formed in the plate body of each of all the fin plates at intervals in the longitudinal direction of the plate body.

* * * * *